US006828788B2

(12) United States Patent
Wang (10) Patent No.: US 6,828,788 B2
(45) Date of Patent: Dec. 7, 2004

(54) APPARATUS AND METHOD FOR MAGNETIC RESONANCE IMAGING USING PARTIAL PARALLEL ACQUISITION (PPA)

(75) Inventor: Jianmin Wang, ShenZhen (CN)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/342,006

(22) Filed: Jan. 14, 2003

(65) Prior Publication Data

US 2003/0164701 A1 Sep. 4, 2003

(30) Foreign Application Priority Data

Jan. 14, 2002 (DE) .......................................... 102 01 063

(51) Int. Cl.$^7$ ................................................ G01V 3/00
(52) U.S. Cl. ...................................... 324/309; 324/307
(58) Field of Search ................................ 324/307, 309; 600/410, 420

(56) References Cited

U.S. PATENT DOCUMENTS

| | | | | | |
|---|---|---|---|---|---|
| 4,908,578 | A | * | 3/1990 | Van Liere .................... | 324/309 |
| 5,243,284 | A | * | 9/1993 | Noll ............................ | 324/309 |
| 5,557,203 | A | * | 9/1996 | Nauerth ....................... | 324/309 |
| 5,810,726 | A | * | 9/1998 | Van Vaals et al. .......... | 600/410 |
| 6,288,542 | B1 | * | 9/2001 | Proksa et al. ................ | 324/307 |
| 6,289,232 | B1 | | 9/2001 | Jakob et al. ................. | 324/307 |
| 6,310,478 | B1 | * | 10/2001 | Heid ............................ | 324/309 |
| 6,476,606 | B2 | * | 11/2002 | Lee ............................. | 324/309 |
| 6,483,306 | B2 | * | 11/2002 | Hahn .......................... | 324/307 |
| 6,487,435 | B2 | * | 11/2002 | Mistretta et al. ............. | 600/420 |
| 6,667,618 | B2 | * | 12/2003 | Thesen ........................ | 324/309 |
| 6,671,536 | B2 | * | 12/2003 | Mistretta ..................... | 600/410 |
| 6,680,610 | B1 | * | 1/2004 | Kyriakos et al. ............ | 324/307 |
| 2003/0030437 | A1 | * | 2/2003 | Bydder et al. ............... | 324/309 |

FOREIGN PATENT DOCUMENTS

| | | |
|---|---|---|
| EP | 0 412 824 | 2/1991 |
| WO | WO 00/72050 | 11/2000 |
| WO | WO 01/69277 | 9/2001 |

\* cited by examiner

Primary Examiner—Diego Gutierrez
Assistant Examiner—Tiffany A. Fetzner
(74) Attorney, Agent, or Firm—Schiff Hardin LLP

(57) ABSTRACT

In a method for magnetic resonance imaging on the basis of a partial parallel acquisition (PPA) for projection reconstruction by exciting nuclear spins and measuring radiofrequency signals arising from the excited spins in the form of projection datasets, under-scanning of k-space with component coils and forming a complete projection dataset is undertaken by means of progressive rotation of a readout gradient through fixed step angles, a Cartesian resultant dataset is produced by transforming the projection dataset onto grid points of a first Cartesian grid with a first grid constant, a Cartesian reference dataset produced by transforming a central region of the projection dataset onto a second Cartesian grid having a grid constant that is smaller than that of the first grid, the sensitivities of the component coils are calculated on the basis of the reference dataset, and an output image is reconstructed on the basis of a linking of the calculated coil sensitivities of the component coils with the resultant dataset.

15 Claims, 8 Drawing Sheets

APPARATUS AND METHOD FOR MAGNETIC RESONANCE IMAGING USING PARTIAL PARALLEL ACQUISITION (PPA)

BACKGROUND OF THE INVENTION

1. Field of the Invention

The present invention is directed in general to magnetic resonance tomography (MRT) as employed in medicine for examining patients. The present invention is more specifically directed to a nuclear magnetic resonance tomography apparatus as well as to a method for operation thereof wherein the MRT data are acquired by a technique known as Partially Parallel Acquisition (PPA).

2. Description of the Prior Art

MRT is based on the physical phenomenon of nuclear magnetic resonance and has been successfully utilized as an imaging method in medicine and biophysics for more than 15 years. In this examination modality, the subject is exposed to a strong, constant magnetic field. As a result, the nuclear spins of the atoms in the subject align, these having been previously irregularly oriented. Radiofrequency waves then excite these "ordered" nuclear spins to a specific oscillation. This oscillation generates the actual measured signal in MRT, this being picked up with suitable reception coils. The measurement subject can be spatially encoded in all three spatial directions by utilizing inhomogeneous magnetic fields generated by gradient coils. MRT allows a free selection of the slice to be imaged, so that tomograms of the human body can be registered in all directions. In medical diagnostics, MRT is particularly distinguished as a tomographic imaging method that is non-invasive with a versatile contrast capability. Due to the excellent presentation of soft tissue, MRT has developed into a modality that is often superior to X-ray computed tomography (CT). MRT is currently based on the application of spin echo frequencies and gradient echo frequencies that enable an excellent image quality with measurement times on the order of magnitude of minutes.

The ongoing technical improvement of the components of MRT systems and the introduction of fast imaging sequences have made an increasing number of areas of application in medicine accessible to MRT. Real-time imaging for supporting minimally invasive surgery, functional imaging in neurology and perfusion measurement in cardiology are only a few examples. Despite the technical advances in designing MRT systems, the exposure time needed for an MRT image remains the limiting factor for many applications of MRT in medical diagnostics. Limits are placed on a further enhancement of the performance of MRT systems with respect to the exposure time from a technical point of view (feasibility) and for reasons of patient protection (stimulation and tissue heating). Numerous efforts therefore have been made in recent years to further shorten the image measurement time by means of new approaches.

One approach for shortening the acquisition time is to reduce the quantity of image data to be acquired. In order to obtain a complete image from such a reduced dataset, however, the missing data either must be reconstructed with suitable algorithms or the faulty image must be corrected from the reduced data.

The registration of the data in MRT occurs in k-space (frequency domain). The MRT image in the image domain is linked to the MRT data in k-space by means of Fourier transformation. The location coding of the subject, who defines the k-space, occurs by means of gradients in all three spatial directions. A distinction is made between the slice selection (determines an exposure slice in the subject, usually the z-axis), the frequency coding (determines a direction in the slice, usually the x-axis) and the phase coding (determines the second dimension within the slice, usually the y-axis).

Figure 5:
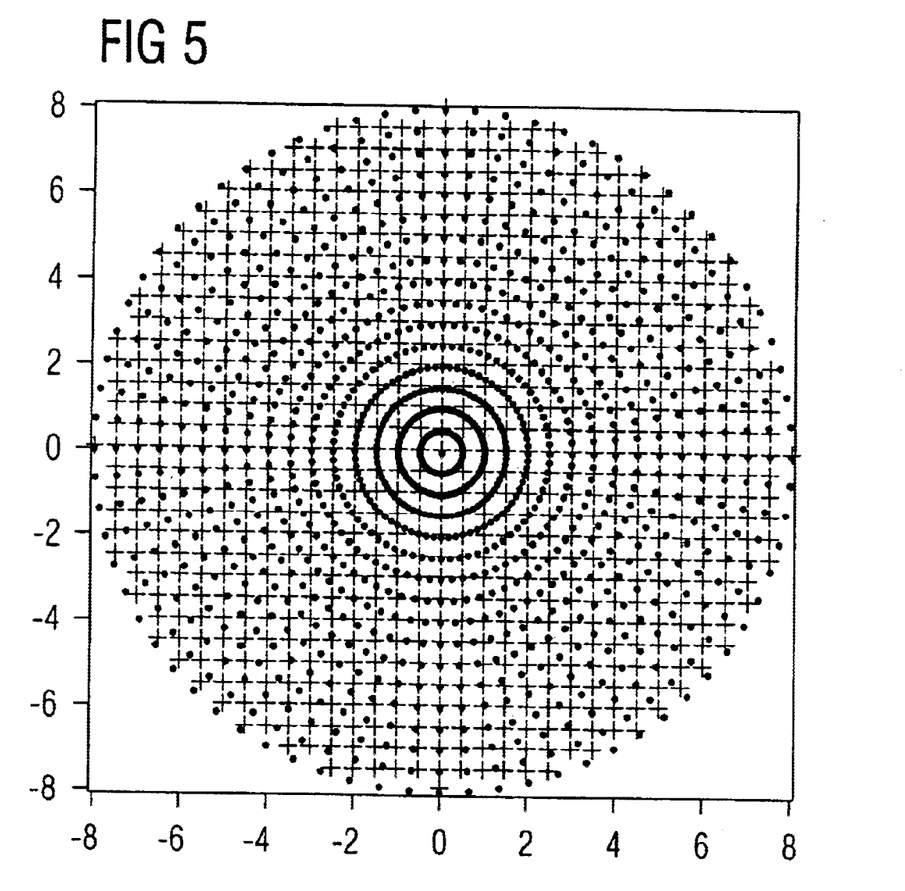
FIG. 5 shows the projection dataset and a Cartesian grid onto which the projection dataset is to be projected.

A k-space that is represented in polar coordinates and scanned projection-by-projection is assumed below. The data of an individual k-space row are frequency-coded with a gradient upon readout. An acquisition method for projection reconstructions employs a gradient that does not scan line-by-line in the Cartesian format, but rotates around the specimen. A projection through the entire specimen from a specific direction thus is obtained in every measuring step, as is a typical dataset for the projection reconstruction in k-space, as shown in FIG. 5. The totality of points corresponding to the registered data in k-space is referred to below as a projection dataset. As mentioned above, the entire projection dataset must be projected onto a Cartesian grid in order to transform the k-space data into an MRT image by means of Fourier transformation. A conversion of the registered projection dataset into such a grid raster of a Cartesian coordinate system in shown in FIG. 5. The grid constant of the grid raster is defined by the projection angle as well as by the size of k-space. Using an approximation method (interpolation method), the values of the grid intersections are interpolated on the basis of the most proximate points in the projection dataset. Each projection in k-space has the spacing $\Delta\alpha$ that is generated by a phase-coding step of the rotating gradient. Since the phase-coding takes a great deal of time compared to the other location codings, most methods for shortening the image measurement time are based on a reduction of the number of time-consuming phase-coding steps. All methods of employing a known technique referred to as partially parallel acquisition (PPA) are essentially based on the above approach.

The basic idea in PPA imaging is that the k-space data are not acquired by an individual coil but by component coils, for example arranged annularly around the subject. Each of the spatially independent coil arrays carries certain spatial information that is utilized in order to achieve a complete location encoding via a combination of the simultaneously acquired coil data. This means that a number of "omitted" projections can be defined in k-space from a single, registered k-space projection.

The PPA methods thus employ spatial information that is contained in the components of a coil arrangement in order to partially replace the time-consuming forwarding of the rotating gradient. As a result, the image measurement time is reduced, corresponding to the ratio of the number of projections of the reduced dataset to the number of rows of the conventional (i.e. complete) dataset. In a typical PPA acquisition, only a fraction (½, ⅓, ¼, etc.) of the projections is acquired compared to the conventional acquisition. A specific reconstruction technique is then applied to the projection data in order to reconstruct the missing projections, and thus to obtain the full field of view (FOV) image in a fraction of the time. The FOV is defined by the size of k-space under observation according to the factor $2\pi k$.

Whereas various PPA methods (SMASH, SENSE) have been successfully employed in many areas of MRT. A disadvantage of these methods is that the complex coil sensitivities of every individual component coil must be exactly known. Conventionally, the coil profiles have been acquired with additional measurement steps. These additional measurement steps can be composed of an additional sequence (for example of a 3D sequence) or can be integrated into the actual measurement sequence. A disadvantage of the previous methods thus is generally in a lengthening of the measurement duration.

SUMMARY OF THE INVENTION

It is an object of the present invention to shorten the overall measurement time of a parallel acquisition method for projection reconstructions. In particular, the acquisition time for the coil sensitivities should thereby be shortened.

This object is inventively achieved in a method for magnetic resonance imaging on the basis of a partial parallel acquisition (PPA) for projection reconstructions by exciting nuclear spins and measuring radiofrequency signals arising from the excited spins in the form of projection datasets, the method including the steps of under-scanning k-space with component coils and forming a complete projection dataset by means of progressive rotation of the readout gradient through angles of fixed steps, producing a Cartesian resultant dataset by transforming the projection dataset onto grid points of a first Cartesian grid with a first grid constant, producing a Cartesian reference dataset by transforming a central region of the projection dataset onto a second Cartesian grid with a grid constant smaller than that of the first grid, calculating the sensitivities of the component coils on the basis of the reference dataset, and reconstructing an output image on the basis of a dataset obtained by linking operation of the calculated coil sensitivities of the component coils with the resultant dataset.

The grid constant of the first Cartesian grid is defined by the step angle and the size of k-space.

Upon doubling of the step angle, in particular, the size of the central region is defined by halving the diameter of the complete projection dataset.

Upon doubling of the step angle, the grid constant of the second Cartesian grid is likewise defined half as large as the grid constant of the first Cartesian grid.

The reconstruction of the output image after the linking of the coil sensitivities of the component coils calculated from the reference dataset with the resultant dataset ensues by means of Fourier transformation.

The component coils can be arranged in both k-space directions.

A further advantage is obtained with an arrangement of the component coils on a ring around the slice to be measured and in the plane thereof.

A magnetic resonance tomography apparatus for the implementation of this method is also described.

The invention also includes a computer software product that implements an above method when it is loaded in a computer device of the magnetic resonance tomography apparatus.

DESCRIPTION OF THE PREFERRED EMBODIMENT

Figure 1:
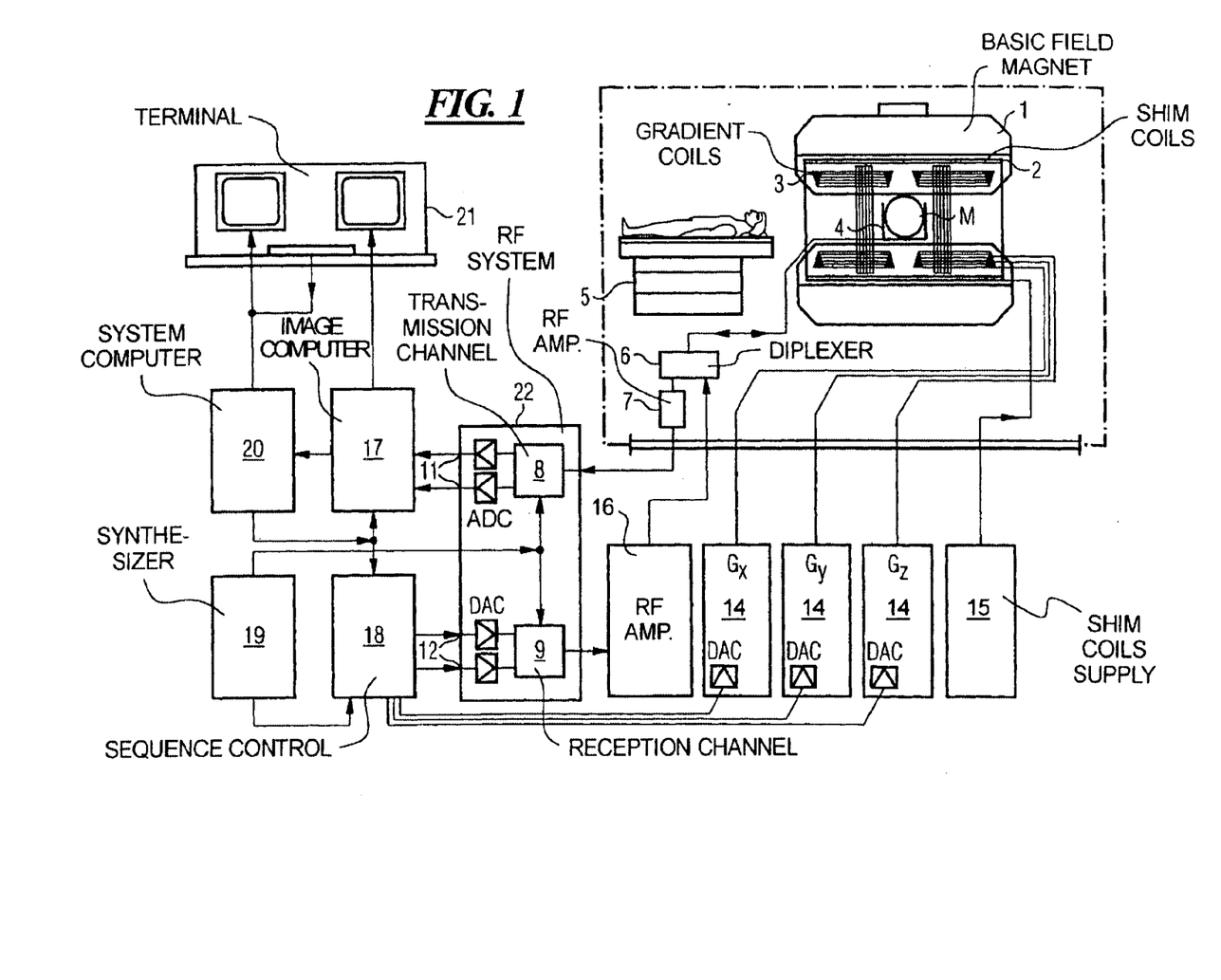
FIG. 1 shows a nuclear magnetic resonance tomography apparatus of the present invention.

FIG. 1 is shows a schematic illustration of a magnetic resonance imaging (magnetic resonance tomography) apparatus for generating a magnetic resonance image of a subject according to the present invention. The basic structure of the nuclear magnetic resonance tomography apparatus corresponds to that of a conventional tomography apparatus (with the differences described below). A basic field magnet 1 generates a temporally constant, strong magnetic field for the polarization or alignment of the nuclear spins in the examination region of a subject such as, for example, part of a human body to be examined. The high homogeneity of the basic magnetic field required for the magnetic resonance measurement is defined in a spherical measurement volume M into which the parts of the human body to be examined are introduced. For supporting the homogeneity demands and, in particular, for eliminating time-invariable influences, shim plates of ferromagnetic material are attached at suitable locations. Time-variable influences are eliminated by shim coils 2 that are driven by a shim power supply 15.

A cylindrical gradient coil system 3 that is composed of three sub-windings is introduced into the basic field magnet 1. Each sub-winding is supplied with power by an amplifier 14 for generating a linear gradient field in the respective direction of the Cartesian coordinate system. The first sub-winding of the gradient field system 3 generates a gradient $G_x$ in the x-direction, the second sub-winding generates a gradient $G_y$ in the y-direction and the third sub-winding generates a gradient $G_z$ in the z-direction. Each amplifier 14 has a digital-to-analog converter that is driven by a sequence controller 18 for generating gradient pulses at the correct time.

Located within the gradient field system 3 is a radiofrequency antenna 4 that converts the radiofrequency pulses output by a radiofrequency power amplifier 10 into a magnetic alternating field for exciting the nuclei of the examination subject or of the region under examination in the subject. The radiofrequency antenna 4 is composed or one or more RF transmission coils and one or more RF reception coils in the form of a preferably linear arrangement of component coils. The RF reception coils of the radiofrequency antenna 4 also convert the alternating field emanating from the precessing nuclear spins, i.e. the nuclear magnetic resonance echo signals (usually produced by a pulse sequence composed of one or more radiofrequency pulses and one or more gradient pulses), into a voltage that is supplied via an amplifier 7 to a radiofrequency reception channel 8 of a radiofrequency system 22. The radiofrequency system 22 further has a transmission channel 9 in which the radiofrequency pulses for the excitation of the nuclear magnetic resonance are generated. The respective radiofrequency pulses are defined digitally as a sequence of complex numbers on the basis of a pulse sequence in the sequence controller 18 prescribed by the system computer 20. The real part and the imaginary part of this number sequence are supplied via respective inputs 12 to a digital-to-analog converter in the radiofrequency system 22 and are supplied therefrom to a transmission channel 9. In the transmission channel 9, the pulse sequences are modulated on a radiofrequency carrier signal having a base frequency corresponding to the resonant frequency of the nuclear spins in the measurement volume.

The switching from transmission to reception mode ensues via a transmission-reception diplexer 6. The RF transmission coil of the radiofrequency antenna 4 emits the radiofrequency pulses for the excitation of the nuclear spins into the measurement volume M and samples resultant echo signals via the RF reception coils. The correspondingly acquired magnetic resonance signals are phase-sensitively demodulated in the reception channel 8 of the radiofrequency system 22 and are converted via respective analog-to-digital converters into real part and imaginary part of the measured signal, which are respectively supplied via outputs 11 to an image computer 17. The image computer 17 reconstructs an image from the measured data acquired in this way. The administration of the measured data, the image data and the control programs ensues via the system computer 20. On the basis of a prescription with control programs, the sequence controller 18 controls the generation of the respectively desired pulse sequences and the corresponding sampling of k-space. In particular, the sequence controller 18 controls the temporally correct switching of the gradients, the emission of the radiofrequency pulses with defined phase and amplitude as well as the reception of the nuclear magnetic resonance signals. The time basis for the radiofrequency system 22 and the sequence controller 18 is made available by a synthesizer 19. The selection of corresponding control programs for generating a magnetic resonance image as well as the display of the generated magnetic resonance image ensues via a terminal (console) 21 that has a keyboard as well as one or more picture screens.

Figure 2:
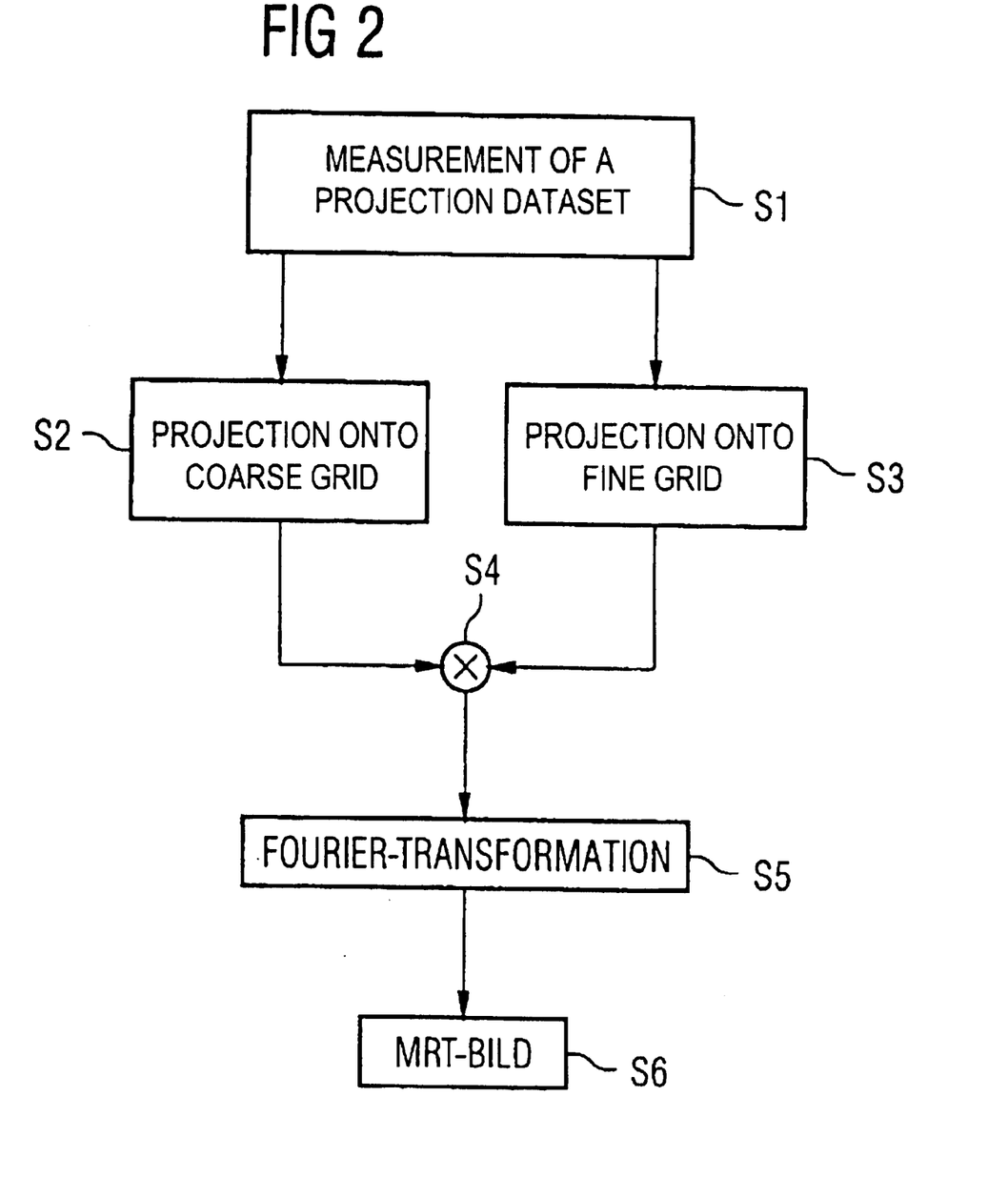
FIG. 2 is a flowchart of a first version of the inventive method.

A first version of the inventive method of partial parallel acquisition (PPA) is now presented below on the basis of the flowchart in FIG. 2. This version employs a radiofrequency coil arrangement for spatial coding that is arranged around the subject, and reduces the time required for the image acquisition because reference measurements for determining the coil sensitivities are avoided. This technique, as realized, for example, in the magnetic resonance apparatus shown in FIG. 1, has the following basic procedure that is schematically shown in FIG. 2:

In step 1, an under-scanning of k-space ensues by measuring a reduced projection dataset. The measurement ensues by means of a progressive rotation of the readout gradient through a fixed step angle. The projection-shaped scanning of k-space ensues by means of component coils that are arranged around the subject in both directions of k-space, or annularly around the subject. The step angle is dimensioned such that an under-scanning of k-space ensues with the component coils.

Figure 6:
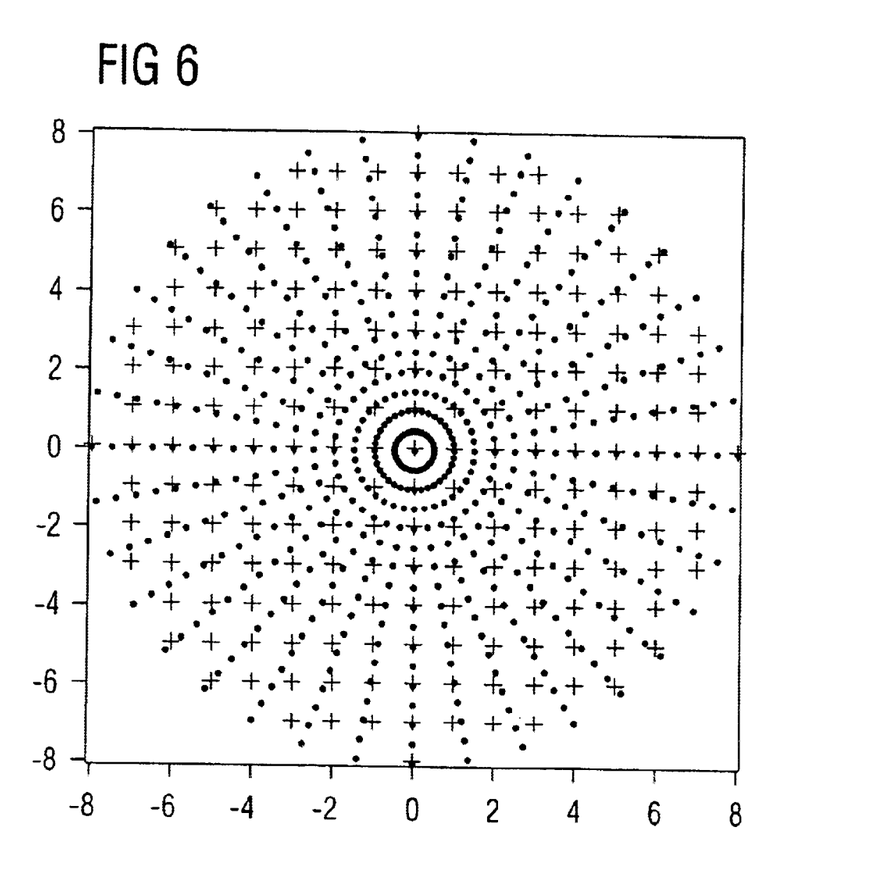
FIG. 6 shows a projection dataset with reduced step angle (reduced projection dataset) onto which a Cartesian grid with a correspondingly increased grid constant is placed.

The result yields an arrangement of k-space data, as shown in FIG. 6.

In the following steps S2 and S3, a Cartesian resultant dataset as well as a Cartesian reference dataset are respectively generated by transformation of the projection dataset, or of an excerpt therefrom, onto different grids. In step 2, the projection ensues onto a first Cartesian grid with a grid constant that corresponds to the resolution of the reduced projection dataset in its outermost region. In step 3, only the central region of the reduced projection dataset is transformed onto a Cartesian grid having a grid constant corresponding to the higher resolution of the reduced projection dataset in this central region.

The steps S2 and S3 are implemented by the system computer 20. The order of the steps S2 and S3 is not significant; they can also ensue simultaneously on the computer. In order to obtain a low-resolution reference dataset from which the individual coil sensitivity profiles of the component coils can be calculated, it is sufficient to transform an excerpt such as, for example, the central region of the reduced projection dataset onto a Cartesian grid having a corresponding resolution. A high resolution of the sensitivities of the component coils as would have to ensue, for example, as a result of a transformation of the entire projection dataset onto a corresponding Cartesian grid, is not necessary since the sensitivities of the component coils exhibit no significant variation over time.

In a further step S4, the reference dataset and the resultant dataset are linked. A high-resolution image can be calculated in k-space by a supplementation of the low-resolution projection dataset with the reference dataset. The Fourier transformation of the high-resolution image in k-space occurs in step S5, as a result of which an MRT image is generated according to step 6.

Figure 3:
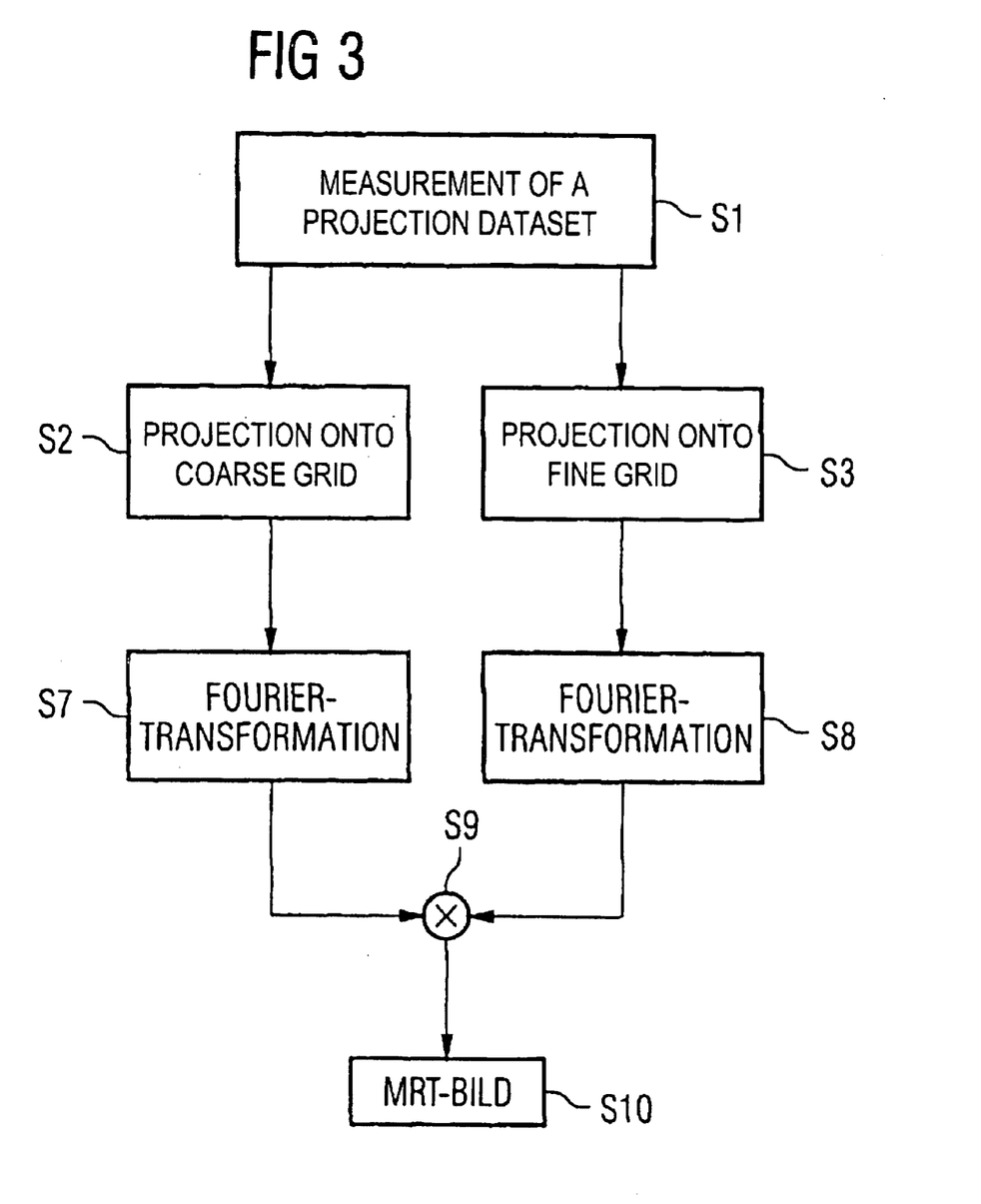
FIG. 3 is a flowchart of a second version of the inventive method.

A method with which the reconstruction of the missing datasets in k-space ensues was described on the basis of FIG. 2. According to FIG. 2, the step S4 ensues before the Fourier transformation. According to a second version of the inventive method, another possibility is to implement the image reconstruction not in k-space (method according to FIG. 2) but in the image domain (method according to FIG. 3). Following steps S2 and S3, respectively separate Fourier transformations are thereby implemented, for the rough grid S7 as well as for the fine grid S8. MRT images with a respectively different characters are thereby obtained. The images that are obtained with step S7 are highly resolved but have involutions since, of course, k-space was under-scanned according to S1 and S2. Although the images that are obtained with step S8 have no involutions, they exhibit low resolution since, according to S1 and S3, only data from the center of k-space were taken into consideration. According to step S9, however, high-resolution MRT images without involutions can be calculated from the two image sets by taking the sensitivities of the component coils into consideration.

The inventive method shall now be presented again in detail on the basis of FIGS. 4 through 8.

Figure 4:
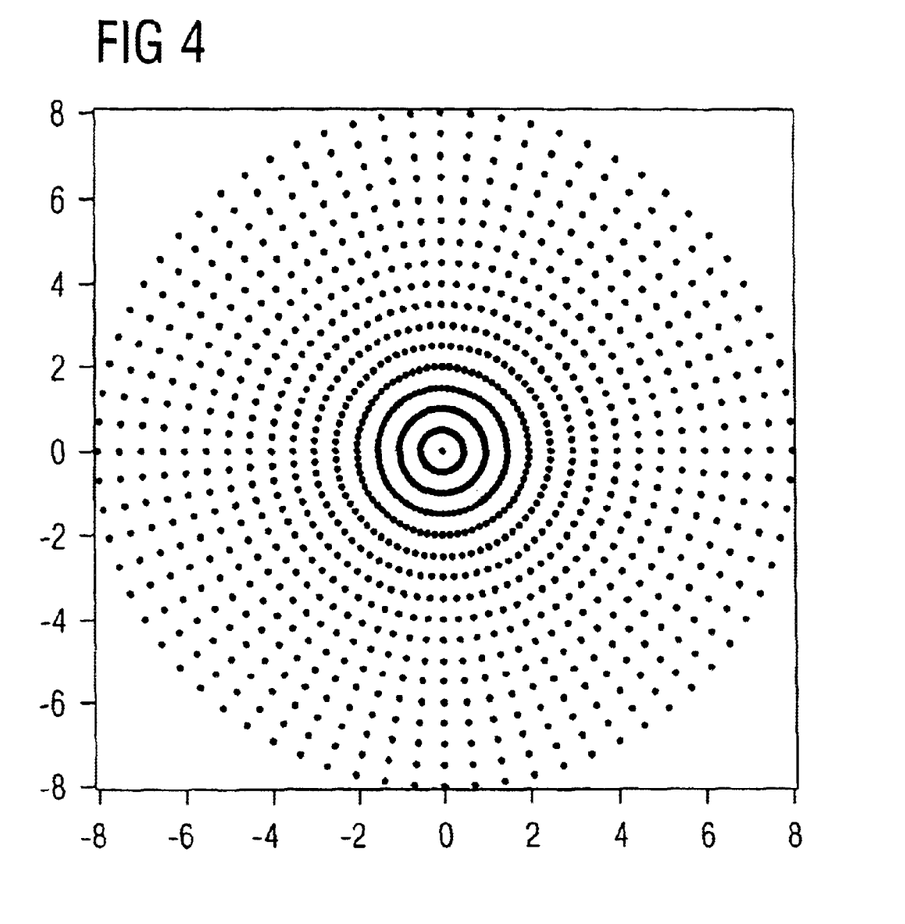
FIG. 4 shows a typical dataset for projection reconstruction in k-space (projection dataset).

FIG. 4 shows a typical dataset for a complete projection reconstruction in the k-space. The points correspond to the registered data in k-space. This image of the projection dataset arises by means of a step-by-step rotation of the readout gradient from 0° through 180°. The entirety of k-space is scanned as a result. The density of the individual readout points determines the radial spacing, which is the same in all projections. This radial spacing of the points, which is also referred to as density of the individual points ("readouts") can be arbitrarily increased without the measurement time being notably lengthened. The step angle of the readout gradient that defines the number of projection steps, however, is the time-determining factor.

The scanning time of the entirety of k-space can be significantly reduced be enlarging the step angle. Enlarging the step angle, however, leads to an under-scanning of k-space resulting in disturbing involutions in the MRT image after a Fourier transformation. The under-scanned dataset in k-space can, however be reconstructed free of involutions with the parallel acquisition technique. Suitably arranged component coils (array coils) as well as the information about their sensitivity profiles are pre-conditions therefor.

According to the present invention, the sensitivity profile information is not acquired with a time-consuming reference measurement, as is conventionally done, but instead is acquired by calculation from a computationally determined, low-resolution reference dataset.

In order to be able to implement the Fourier transformation that ultimately supplies the actual MRT image, the registered data in k-space must be projected onto a Cartesian grid. This procedure is referred to as gridding. The grid constant of the Cartesian grid must correspond to the step angle of the readout gradient as well as to the size of k-space.

FIG. 6 shows how a projection dataset with a reduced step angle is generated according to the PPA method. The reduction of the step angle—by a factor of 2 in this example—reduces the acquisition time of the registered data in k-space by half. In order to adapt the Cartesian grid, onto which the reduced projection dataset is to be transformed, to the resolution of the projection dataset, the spacing between the neighboring grid points must be correspondingly incremented by a factor of 2. The result is an under-scanned image in k-space that has been transformed onto a correspondingly coarsened grid. The information required for a complete high-resolution presentation of the subject in k-space must now be determined by the array coils, which are arranged location-dependent. The sensitivity profiles of these array coils are required for this purpose.

In order to avoid a time-consuming measurement of the coil sensitivities, in accordance with the invention a reference dataset with low resolution is generated, with only the central region of the reduced projection dataset being transformed onto a Cartesian grid in the center of k-space that is adapted to the projection dataset with respect to the resolution.

Figure 7:
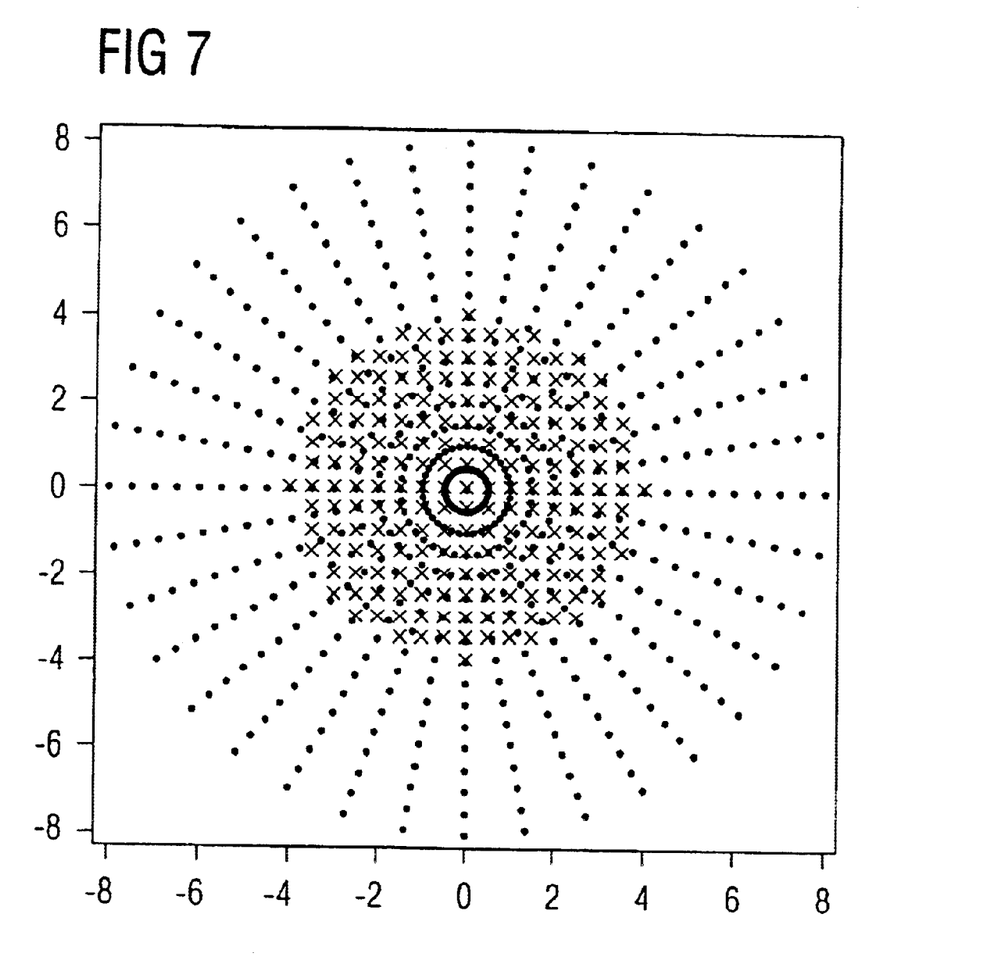
FIG. 7 shows the reduced projection dataset (reduced by a factor of 2) in the center of which (diameter/2) a Cartesian grid with the original grid constant has been placed.
Figure 8:
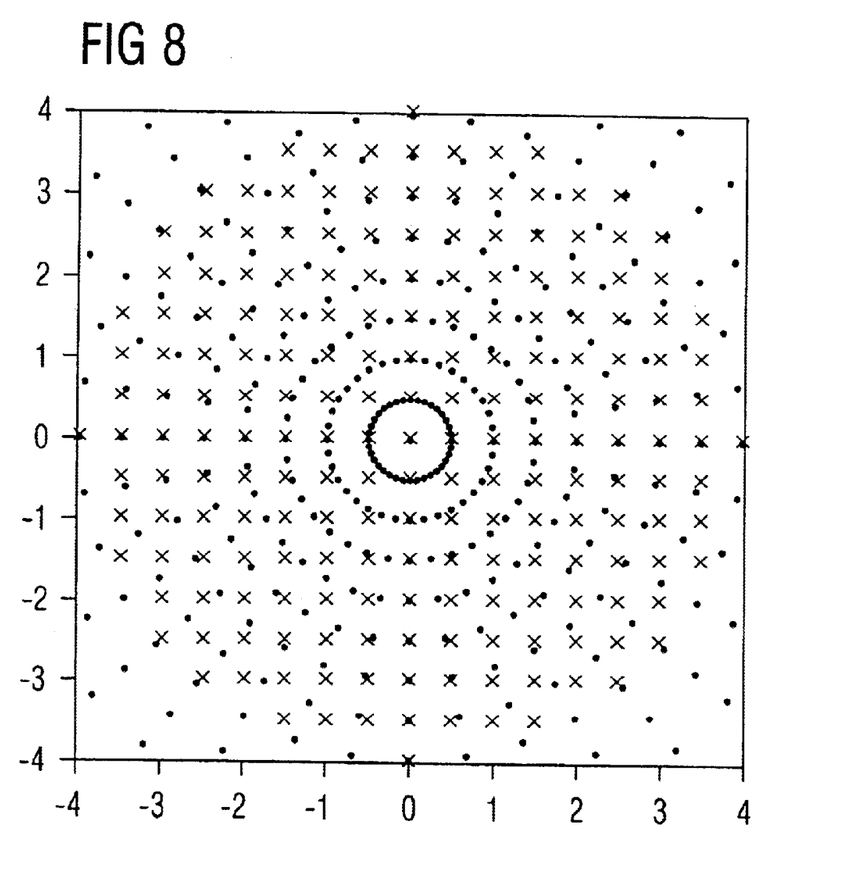
FIG. 8 shows the central region of the reduced projection dataset onto which the Cartesian grid with the original grid constant has been placed.

The excerpt of this central region of the reduced projection dataset is shown enlarged in FIG. 8. The dataset from this second gridding is then employed as a reference dataset from which the weighting factors of the sensitivity profiles of the individual array coils are calculated. FIG. 7 shows the region in the center of k-space with the correspondingly adapted Cartesian grid. Together with the under-scanned dataset in k-space that, by transformation onto the correspondingly coarser grid, represents a resultant dataset, high-resolution images can be reconstructed in k-space from which a high-resolution MRT image can be generated by Fourier transformation.

Although modifications and changes may be suggested by those skilled in the art, it is the intention of the inventor to embody within the patent warranted hereon all changes and modifications as reasonably and properly come within the scope of the contribution to the art.

I claim as my invention:

1. In a method for magnetic resonance imaging using partial parallel acquisition for projection reconstruction, including exciting nuclear spins in a subject and acquiring radio frequency signals arising from the excited nuclear spins under a readout gradient in a plurality of individual projection datasets, with a plurality of RF reception coils having respective sensitivity profiles, and entering said projection datasets into k-space, the improvement comprising:

under-scanning k-space with said coils and forming a complete but under-scanned projection dataset by progressively rotating said readout gradient through successive fixed step angles;

producing a Cartesian resultant dataset by transforming said complete but under-scanned projection dataset in k-space onto grid points of a first Cartesian grid with a first grid constant;

producing a Cartesian reference dataset by transforming a central region of the complete but under-scanned projection dataset in k-space onto a second Cartesian grid having a second grid constant that is smaller than said first grid constant;

calculating the respective sensitivity profiles of each of said plurality of RF reception coils from said reference dataset; and reconstructing a resultant image of said subject by linking the respective sensitivity profiles of said plurality of RF reception coils, calculated from said reference dataset, with said resultant dataset.

2. A method as claimed in claim 1 wherein k-space has a size, and comprising defining said first grid constant dependent on said step angle and said k-space size.

3. A method as claimed in claim 1 comprising doubling a magnitude of said step angle and determining a size of said central region by halving a diameter of a complete but under-scanned projection dataset.

4. A method as claimed in claim 3 comprising setting said second grid constant to one-half of said first grid constant.

5. A method as claimed in claim 1 comprising reconstructing said resultant image, after linking said sensitivity profiles with said resultant dataset, by Fourier transformation.

6. A method as claimed in claim 1 wherein k-space has perpendicular directions, and comprising arranging said plurality of RF reception coils in said k-space directions.

7. A method as claimed in claim 6 comprising arranging said plurality of RF reception coils in a ring around a planar slice of a subject from which said complete but under-scanned projection data are obtained, and in said plane of said slice.

8. A magnetic resonance imaging apparatus performing partial parallel acquisition with projection reconstruction comprising:

a magnetic resonance scanner including an RF system, which excites nuclear spins in a subject and acquires radio frequency signals arising from the excited nuclear spins in a plurality of individual projection datasets, with a plurality of RF reception coils having respective sensitivity profiles, and a gradient system which generates a readout gradient under which said individual projection datasets are read out for entry into k-space;

a control unit operating said scanner to under-scan k-space with said plurality of RF reception coils and form a complete but under-scanned projection dataset by progressively rotating said readout gradient through successive fixed step angles;

an image computer supplied with said complete but under-scanned projection dataset producing a Cartesian resultant dataset by transforming said complete but under-scanned projection dataset in k-space onto grid points of a first Cartesian grid with a first grid constant;

said image computer producing a Cartesian reference dataset by transforming a central region of the complete but under-scanned projection dataset in k-space onto a second Cartesian grid having a second grid constant that is smaller than said first grid constant;

said image computer calculating the respective sensitivity profiles of each of said plurality of RF reception coils from said reference dataset; and said image computer reconstructing a resultant image of said subject by linking the respective sensitivity profiles of said plurality of RF reception coils, calculated from said reference dataset, with said resultant dataset.

9. An apparatus as claimed in claim 8 wherein k-space has a size, and wherein said image computer defines said first grid constant dependent on said step angle and said k-space size.

10. An apparatus as claimed in claim 8 wherein said control unit doubles a magnitude of said step angle and determines a size of said central region by having a diameter of a complete but under-scanned projection dataset.

11. An apparatus as claimed in claim 10 wherein said image computer sets said second grid constant to one-half of said first grid constant.

12. An apparatus as claimed in claim 8 wherein said image computer reconstructs said resultant image, after linking said sensitivity profiles with said resultant dataset, by Fourier transformation.

13. An apparatus as claimed in claim 8 wherein k-space has perpendicular directions, and said plurality of RF reception coils are arranged in said k-space directions.

14. An apparatus as claimed in claim 13 wherein said plurality of RF reception coils are arranged in a ring around a planar slice of a subject from which said complete but under-scanned projection data are obtained, and in said plane of said slice.

15. A computer program product that operates a magnetic resonance imaging apparatus using partial parallel acquisition with image reconstruction, wherein nuclear spins are excited in a subject and the radio frequency signals arising from the excited nuclear spins are acquired under a readout gradient in a plurality of individual projection datasets, with a plurality of RF reception coils having respective sensitivity profiles, and wherein said plurality of individual projection datasets are entered into k-space, said computer program product being loadable into at least one computer of said magnetic resonance imaging apparatus, with the at least one computer performing:

under-scanning k-space with said plurality of RF reception coils and forming a complete but under-scanned projection dataset by progressively rotating said readout gradient through successive fixed step angles;

producing a Cartesian resultant dataset by transforming said complete but under-scanned projection dataset in k-space onto grid points of a first Cartesian grid with a first grid constant;

producing a Cartesian reference dataset by transforming a central region of the complete but under-scanned projection dataset in k-space onto a second Cartesian grid having a second grid constant that is smaller than said first grid constant;

calculating the respective sensitivity profiles of each of said plurality of RF reception coils from said reference dataset; and reconstructing a resultant image of said subject by linking the respective sensitivity profiles of said plurality of RF reception coils, calculated from said reference dataset, with said resultant dataset.

* * * * *